(12) United States Patent
Zhu et al.

(10) Patent No.: US 12,325,017 B2
(45) Date of Patent: Jun. 10, 2025

(54) PHOTOELECTRIC FLUID FIELD CLUSTER CATALYTIC METHOD FOR ATOMIC-SCALE DETERMINISTIC PROCESSING

(71) Applicant: Zhejiang University, Hangzhou (CN)

(72) Inventors: Wule Zhu, Hangzhou (CN); Sidong Wu, Hangzhou (CN); Qi Sun, Hangzhou (CN); Fang Han, Hangzhou (CN); Wei Gao, Hangzhou (CN); Caoyang Xue, Hangzhou (CN); Xiang Zhao, Hangzhou (CN); Bingchun Jia, Hangzhou (CN); Jingyuan Wang, Hangzhou (CN); Weijian Zhang, Hangzhou (CN); Bingfeng Ju, Hangzhou (CN)

(73) Assignee: Zhejiang University, Hangzhou (CN)

( * ) Notice: Subject to any disclaimer, the term of this patent is extended or adjusted under 35 U.S.C. 154(b) by 0 days.

(21) Appl. No.: 19/015,383

(22) Filed: Jan. 9, 2025

(65) Prior Publication Data

US 2025/0144609 A1     May 8, 2025

(30) Foreign Application Priority Data

Feb. 20, 2024    (CN) .......................... 202410186779.4

(51) Int. Cl.
*B24B 1/00*      (2006.01)
*B01J 35/33*     (2024.01)
(Continued)

(52) U.S. Cl.
CPC .............. *B01J 35/39* (2024.01); *B01J 35/33* (2024.01); *B01J 35/45* (2024.01); *B01J 37/0215* (2013.01);
(Continued)

(58) Field of Classification Search
None
See application file for complete search history.

(56) References Cited

U.S. PATENT DOCUMENTS

| 2003/0171077 | A1 | 9/2003 | Corb |
| 2017/0069506 | A1 | 3/2017 | Yamauchi et al. |
| 2020/0390803 | A1 | 12/2020 | Tian et al. |

FOREIGN PATENT DOCUMENTS

CN       111421472    *   7/2020  ......... B01J 19/0006

* cited by examiner

*Primary Examiner* — Jiong-Ping Lu

(57) ABSTRACT

A photoelectric fluid field cluster catalytic method for atomic-scale deterministic processing, comprises the following steps: selecting nanoparticles with photocatalytic activity as a photocatalytic medium, and using a photoreduction method to realize the precipitation of metal nanoparticles on a surface of the photocatalytic medium, thus creating photoelectrocatalytic clusters; illuminating a coupling area between a surface to be processed of a workpiece, the photoelectrocatalytic clusters and a flexible tool with a catalytic light source, and simultaneously applying a bias voltage to a conductive tray of the workpiece; and applying a normal load to a flexible tool head and setting a rotation speed to generate a hydrodynamic pressure to drive a polishing solution to flow, thus enabling controllable removal with atomic-level precision. The disclosure utilizes the metal particles in the photoelectrocatalytic clusters to capture photogenerated electrons, thereby prolonging the lifetime of photogenerated carriers.

9 Claims, 3 Drawing Sheets

(51) Int. Cl.
  *B01J 35/39*     (2024.01)
  *B01J 35/45*     (2024.01)
  *B01J 37/02*     (2006.01)
  *B24B 37/04*     (2012.01)
  *C09G 1/00*      (2006.01)
  *C09G 1/02*      (2006.01)
  *C09G 1/04*      (2006.01)
  *C09G 1/06*      (2006.01)
  *H01L 21/306*    (2006.01)
  *H01L 21/321*    (2006.01)

(52) U.S. Cl.
  CPC ................ *B24B 1/00* (2013.01); *B24B 37/04* (2013.01); *B24B 37/042* (2013.01); *B24B 37/044* (2013.01); *B24B 37/046* (2013.01); *C09G 1/00* (2013.01); *C09G 1/02* (2013.01); *C09G 1/04* (2013.01); *C09G 1/06* (2013.01); *H01L 21/30625* (2013.01); *H01L 21/3212* (2013.01); *H01L 21/32125* (2013.01)

PHOTOELECTRIC FLUID FIELD CLUSTER CATALYTIC METHOD FOR ATOMIC-SCALE DETERMINISTIC PROCESSING

CROSS-REFERENCE TO RELATED APPLICATIONS

This application claims priority to Chinese Patent Application No. 202410186779.4 with a filing date of Feb. 20, 2024. The content of the aforementioned application, including any intervening amendments thereto, is incorporated herein by reference.

BACKGROUND OF THE INVENTION

1. Technical Field

The disclosure belongs to the field of ultra-precision machining, and particularly relates to a photoelectric fluid field cluster catalytic method for atomic-scale deterministic processing.

2. Description of Related Art

With the rapid development of high-end weaponry manufacturing, optical precision engineering, high-power optoelectronic devices, and atomic-scale manufacturing of third-generation semiconductors, there are increasing demands for the surface roughness of hard and brittle curved materials. For example, the X-ray mirrors of synchrotron radiation sources, which are produced from polished monocrystalline silicon, must achieve or approach atomic-level precision in surface shape to meet the high reflectivity requirements based on Rayleigh criteria. The atomic-scale efficient manufacturing of third-generation semiconductors, such as diamond, silicon carbide, and gallium nitride, is essential for the development of high-power devices and even quantum devices.

For ultra-precision polishing of hard and brittle curved surfaces, traditional polishing methods include airbag polishing, which can adapt to the shape of the workpiece but can cause a certain degree of scratching on the surface due to mechanical contact between the tool and the workpiece. To achieve smaller-scale manufacturing, a series of non-contact processing methods have been proposed, such as femtosecond laser micro-nano cold machining using Coulomb explosions to remove crystalline materials; ion beam polishing, which bombards surface materials with high-energy ion beams; water jet polishing, where high-speed water jets carrying abrasive particles impact the workpiece surface to remove materials; and magnetorheological finishing, which uses strong magnetic fields to control magnetorheological fluids for polishing the workpiece. However, these non-contact processing methods still have certain shortcomings, such as subsurface damage, the inability to achieve a balance between material removal rate and surface quality, and complex control systems.

Some researchers have proposed photocatalytic-assisted polishing, which primarily relies on certain photocatalytic abrasive particles, such as $TiO_2$, $ZnO$, $SnO_2$, $ZrO_2$, $CdS$. Under ultraviolet light, an oxide layer is formed on the surface, which is then removed through mechanical action of the abrasive particles to achieve material removal. However, the oxidation capability of photocatalysts is relatively weak, the lifetime of photogenerated carriers is short, and the formed oxide layer tends to be uneven. Additionally, the hardness of the photocatalysts is generally low (Mohs hardness<6), resulting in a low material removal rate and poor surface quality. Later studies employed silica sol to assist in material removal, often adding strong oxidizing agents such as $H_2O_2$ and $KMnO_4$ to the polishing solution. Through UV light catalysis, an oxide layer is formed on the layer, which is then removed using silica sol to achieve material removal. However, the oxide layer formed on curved workpiece surfaces may be uneven, and removing the oxide layer with silica sol could result in poor surface quality, including scratches or pits. Furthermore, the use of strong oxidizers may cause environmental pollution.

BRIEF SUMMARY OF THE INVENTION

The objective of the disclosure is to provide a photoelectric fluid field cluster catalytic method for atomic-scale deterministic processing, aimed at addressing the issues present in existing photocatalytic polishing methods, such as short lifetime of photogenerated carriers, low material removal rates, poor surface quality, and potential environmental pollution.

To solve the above technical problems, the disclosure provides the following technical scheme.

The disclosure relates to a photoelectric fluid field cluster catalytic method for atomic-scale deterministic processing, comprising the following steps:

S1, selecting nanoparticles with photocatalytic activity as a photocatalytic medium, and using a photoreduction method to realize the precipitation of metal nanoparticles on a surface of the photocatalytic medium, thus creating photoelectrocatalytic clusters;

S2, mixing the photoelectrocatalytic clusters with deionized water to prepare a polishing solution;

S3, illuminating a coupling area between a surface to be processed of a workpiece, the photoelectrocatalytic clusters and a flexible tool with a catalytic light source, and simultaneously applying a bias voltage to a conductive tray of the workpiece to control its potential and form a spatial electric field between the photoelectrocatalytic clusters and the workpiece; and S4, applying a normal load to a flexible tool head and setting a rotation speed to generate a hydrodynamic pressure that maintains a gap between the tool head and the workpiece surface, and driving the polishing solution in the gap to flow through a flow field, thus enabling controllable removal with atomic-level precision under the interfacial synergistic photoelectrocatalytic effect.

Preferably, in S1, using a photoreduction method to realize the precipitation of metal nanoparticles on a surface of the photocatalytic medium specifically comprises: uniformly dispersing the nanoparticles with photocatalytic activity in a metal salt solution, and irradiating the solution with ultraviolet light while performing magnetic stirring, allowing metal elements in the metal salt solution to capture photogenerated electrons on the surface of the photocatalytic medium, thus initiating a photoreduction reaction, resulting in the precipitation of the metal nanoparticles on the surface of the photocatalytic medium.

Preferably, in S1, the photocatalytic medium is one of $TiO_2$, $ZnO$, $SnO_2$, $ZrO_2$ and $CdS$, with a particle size of 20-100 nm, and the metal salt solution is a solution of platinum chloride or silver nitrate.

Preferably, in S2, the photoelectrocatalytic clusters are mixed with the deionize water at a ratio of 1-20 g/L to obtain the polishing solution.

Preferably, in S3, the workpiece is fixed to the conductive tray using conductive carbon paste and connected to a potentiometer, allowing the workpiece to function as a working electrode; additionally, a counter electrode and a reference electrode with a constant potential are added to the polishing solution, and a potential of the working electrode is controlled based on the reference electrode, thereby establishing a stable spatial electric field between the workpiece and the photoelectrocatalytic clusters.

Preferably, a potential difference between the counter electrode and the working electrode ranges from −50 V to +50 V.

Preferably, in S3, the catalytic light source is mounted on an adapter device, allowing for control over an emission angle of the catalytic light source and adjustment of a position of a light spot irradiated on the surface to be processed, thus ensuring continuous irradiation in the coupling area between the flexible tool, the photoelectrocatalytic clusters, and the workpiece; and the single-photon energy of the catalytic light source exceeds a bandgap of the photocatalytic medium, and a wavelength of the catalytic light source ranges from 200 nm to 800 nm.

Preferably, in S4, the normal load and the rotation speed are applied to the flexible tool head to create a balance between the hydrodynamic pressure and the load, resulting in a stable gap of 1-200 μm; the photoelectrocatalytic clusters are driven through the flow field into contact with the workpiece surface, resulting in an atomic-level controllable removal function within a confined area under the interfacial synergistic photoelectrocatalytic effect; additionally, a position of the tool is adjusted using x, y, and z displacement stages to adapt to a shape of the workpiece.

Preferably, in S4, adjustments to an output power and wavelength of the catalytic light source, the rotation speed of the flexible tool, and a potential difference applied between the workpiece and a counter electrode allow for control over localized photoelectrocatalytic reactions in the coupling area between the tool, the photoelectrocatalytic clusters, and the workpiece, and an atomic-level removal function within a confined area of the workpiece is generated, enabling deterministic and controllable removal with single-atomic-layer precision on any surface shape through deconvolution.

Compared with the prior art, the disclosure has the following beneficial effects:

1. The photoelectric fluid field cluster catalytic method for atomic-scale deterministic processing provided by the disclosure selects nanoparticles with photocatalytic activity as a photocatalytic medium; uses a photoreduction method to realize the precipitation of metal nanoparticles on a surface of the photocatalytic medium, thus creating photoelectrocatalytic clusters; and mixes the photoelectrocatalytic clusters with deionized water to prepare a polishing solution. Based on the polishing solution, photocatalytic-assisted polishing is carried out. The photon energy corresponding to a catalytic light source wavelength is greater than a bandgap of the photoelectrocatalytic clusters. After absorbing photon energy, valence band electrons of the photoelectrocatalytic clusters transition to a conduction band, generating a large number of electron-hole pairs. Under photocatalytic reactions, a significant number of hydroxyl radicals are produced and adsorbed onto the surface of the nanoparticle clusters, forming surface hydroxyl groups. Meanwhile, the metallic particles within the clusters capture photogenerated electrons, prolonging the lifetime of photogenerated carriers. Under the influence of a potentiometer, the photoelectrocatalytic clusters form a spatial electric field with a surface to be processed, inhibiting the recombination of electron-hole pairs while creating numerous new reactive sites on the surface of the metal particles, thus significantly increasing the photocatalytic reaction rate within a confined area.

2. When mixing the photoelectrocatalytic clusters with deionized water to prepare the polishing solution, interfacial bridged bonds are formed in pure water through interfacial synergistic photoelectrocatalytic reactions. Under the driving of a flow field, back bonds of surface atoms are broken, achieving material removal with single-atomic-layer precision. This method avoids surface scratches caused by hard abrasive particles and is more environmentally friendly.

3. A potential difference formed between a workpiece and a counter electrode helps control the formation of a stable spatial electric field between the surface of the photoelectrocatalytic clusters and the workpiece to be processed. Additionally, the metal particles precipitated within the clusters can capture the photogenerated electrons from a conduction band of the photocatalytic medium, inhibiting the recombination of electron-hole pairs. At the same time, the metal particles also form numerous chemical reaction sites on their surfaces by capturing the photogenerated electrons, achieving localized synergistic photoelectrocatalytic effects on the surface atoms of the workpiece and promoting atomic-level precision manufacturing of materials.

4. Adjustments to an output power and wavelength of a catalytic light source, a rotation speed of a flexible tool, and a potential difference applied between the workpiece and a counter electrode allow for control over the catalytic reaction rate of the photoelectrocatalytic clusters within the confined area, resulting in a controllable atomic-level removal function within the confined area, thus enabling controllable removal with atomic-level precision on any surface shape through deconvolution.

DETAILED DESCRIPTION OF THE INVENTION

Figure 1:
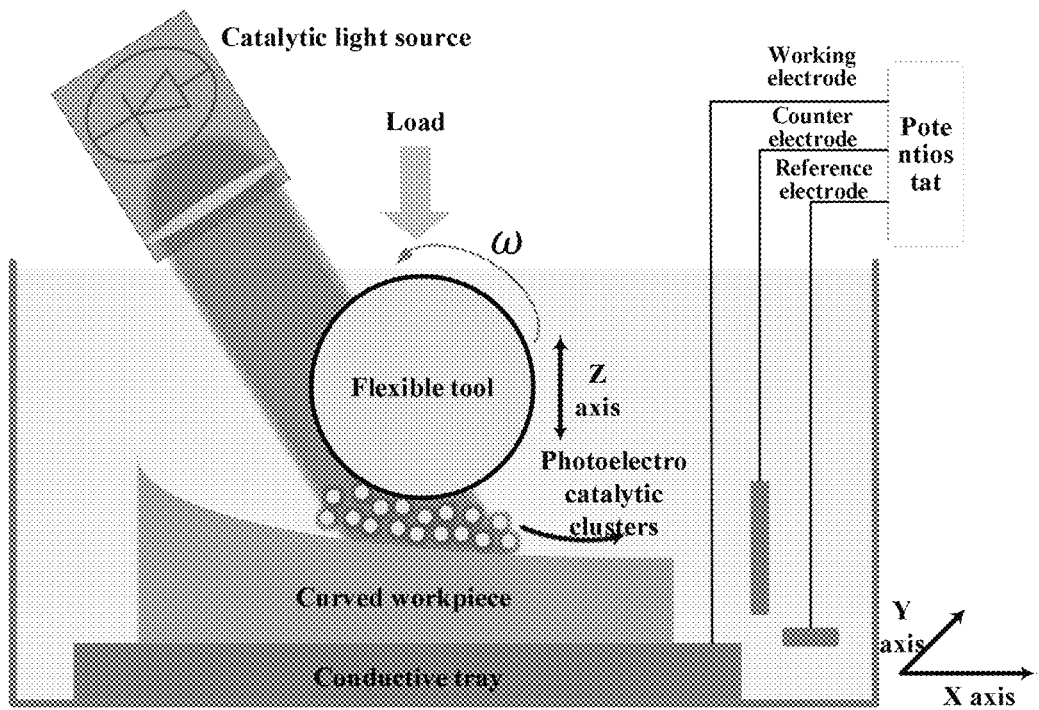
FIG. 1 shows a device for a photoelectric fluid field cluster catalytic method for atomic-scale deterministic processing.

The technical scheme of the disclosure will be further explained in detail below through specific embodiments, which are made to illustrate the disclosure, but not to limit it. All other embodiments obtained by those of ordinary skill in the art based on the embodiments of the present application without inventive effort are within the scope of the present application.

Figure 2:
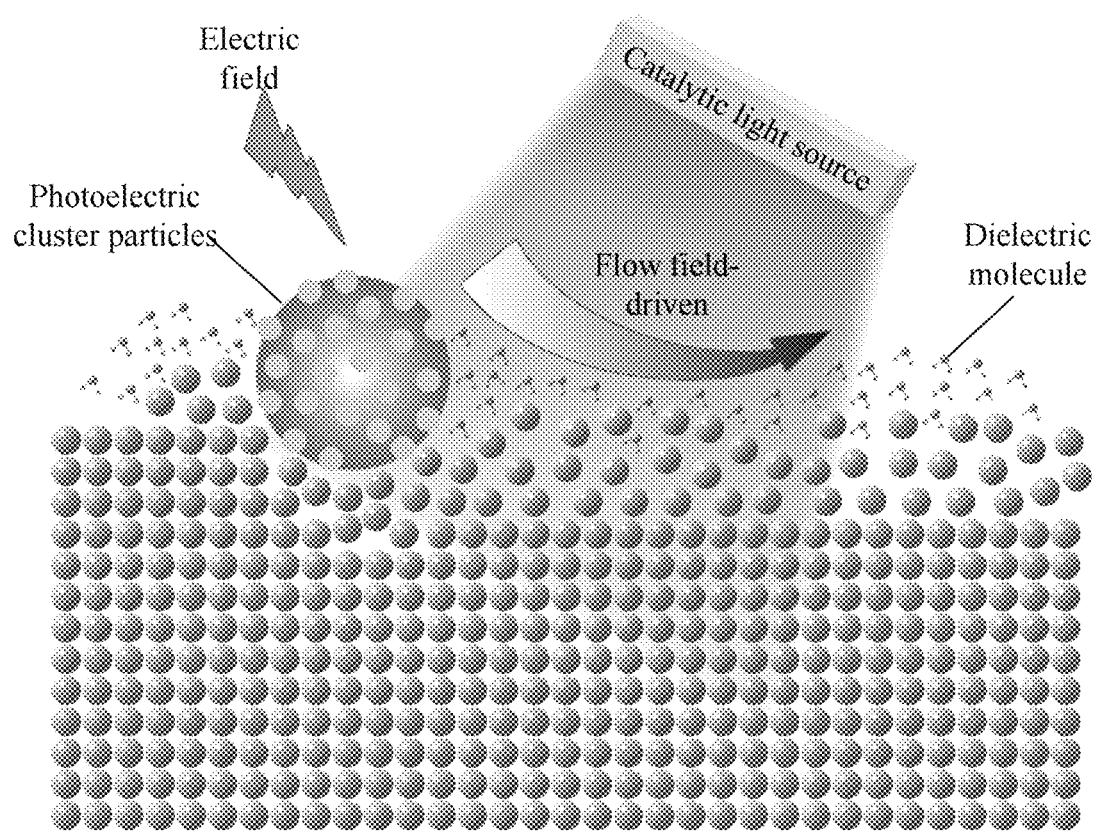
FIG. 2 is a flowchart of a photoelectric fluid field cluster catalytic method for atomic-scale deterministic processing.

The disclosure relates to a photoelectric fluid field cluster catalytic method for atomic-scale deterministic processing, comprising the following steps:

S1, selecting nanoparticles with photocatalytic activity as a photocatalytic medium, such as $TiO_2$, ZnO, $SnO_2$, $ZrO_2$ and CdS, with a particle size of 20-100 nm, and using a photoreduction method to realize the precipitation of metal nanoparticles on a surface of the photocatalytic medium; specifically, uniformly dispersing the nanoparticles with photocatalytic activity in a metal salt solution, and irradiating the solution with ultraviolet while performing magnetic stirring, allowing metal ions in the metal salt solution to capture photogenerated electrons on the surface of the photocatalytic medium, thus initiating a photoreduction reaction, resulting in the precipitation of the metal nanoparticles on the surface of the photocatalytic medium, so as to create photoelectrocatalytic clusters with a Mohs hardness of 3-6;

S2, mixing the photoelectrocatalytic clusters with deionized water at a ratio of 1-20 g/L to prepare a polishing solution;

S3, fixing a workpiece with a curved surface to be processed, which is made of materials such as silicon carbide, gallium nitride, or diamond with a Mohs hardness greater than 9.5, to a conductive tray using conductive carbon paste, and introducing the polishing solution prepared in S2 into a processing chamber, ensuring that the polishing solution covers the workpiece with a curved surface to be processed and the photoelectrocatalytic clusters are evenly distributed around the workpiece; illuminating a coupling area between a surface to be processed of the workpiece, the photoelectrocatalytic clusters and a flexible tool with a catalytic light source, and connecting the conductive tray to a potentiometer, allowing the workpiece to function as a working electrode; adding a counter electrode and a reference electrode with a constant potential to the polishing solution, and controlling a potential of the working electrode based on the reference electrode; using an adapter device to control an emission angle of the catalytic light source and adjust a position of a light spot irradiated on the surface to be processed, thus ensuring continuous irradiation in the coupling area between the flexible tool, the photoelectrocatalytic clusters, and the workpiece; making the single-photon energy of the catalytic light source greater than a bandgap of the photocatalytic medium, and a wavelength of the catalytic light source from 200 nm to 800 nm; additionally, applying a bias voltage to the conductive tray, creating a potential difference of −50 V to +50 V between the workpiece with a curved surface to be processed and the photoelectrocatalytic clusters, thereby establishing a stable spatial electric field between them;

S4, applying a normal load to the flexible tool and setting a rotation speed to create a balance between a hydrodynamic pressure and the load, resulting in a stable gap of 1-200 μm; driving the polishing solution in the gap to flow through a flow field, thus enabling the photoelectrocatalytic clusters to make contact with the workpiece surface; under the combined action of the catalytic light source and an electric field, forming interfacial bridged bonds through interfacial bonding reactions between the photoelectrocatalytic clusters and surface atoms of the workpiece; breaking back bonds of the surface atoms through the flow field-driven photoelectrocatalytic clusters, facilitating material removal on the surface to be processed with single-atomic-layer precision; additionally, adjusting a position of the tool using x, y, and z displacement stages to adapt to a shape of the workpiece, as shown in FIGS. 1 and 2, where the medium molecules in FIG. 2 are water molecules; here, during this process, adjustments to an output power and wavelength of the catalytic light source, the rotation speed of the flexible tool, and the potential difference applied between the workpiece and the counter electrode allow for control over localized photoelectrocatalytic reactions in the coupling area between the tool, the photoelectrocatalytic clusters, and the workpiece, and an atomic-level removal function within a confined area of the workpiece is generated, enabling deterministic and controllable removal with single-atomic-layer precision on any surface shape through deconvolution.

Figure 3:
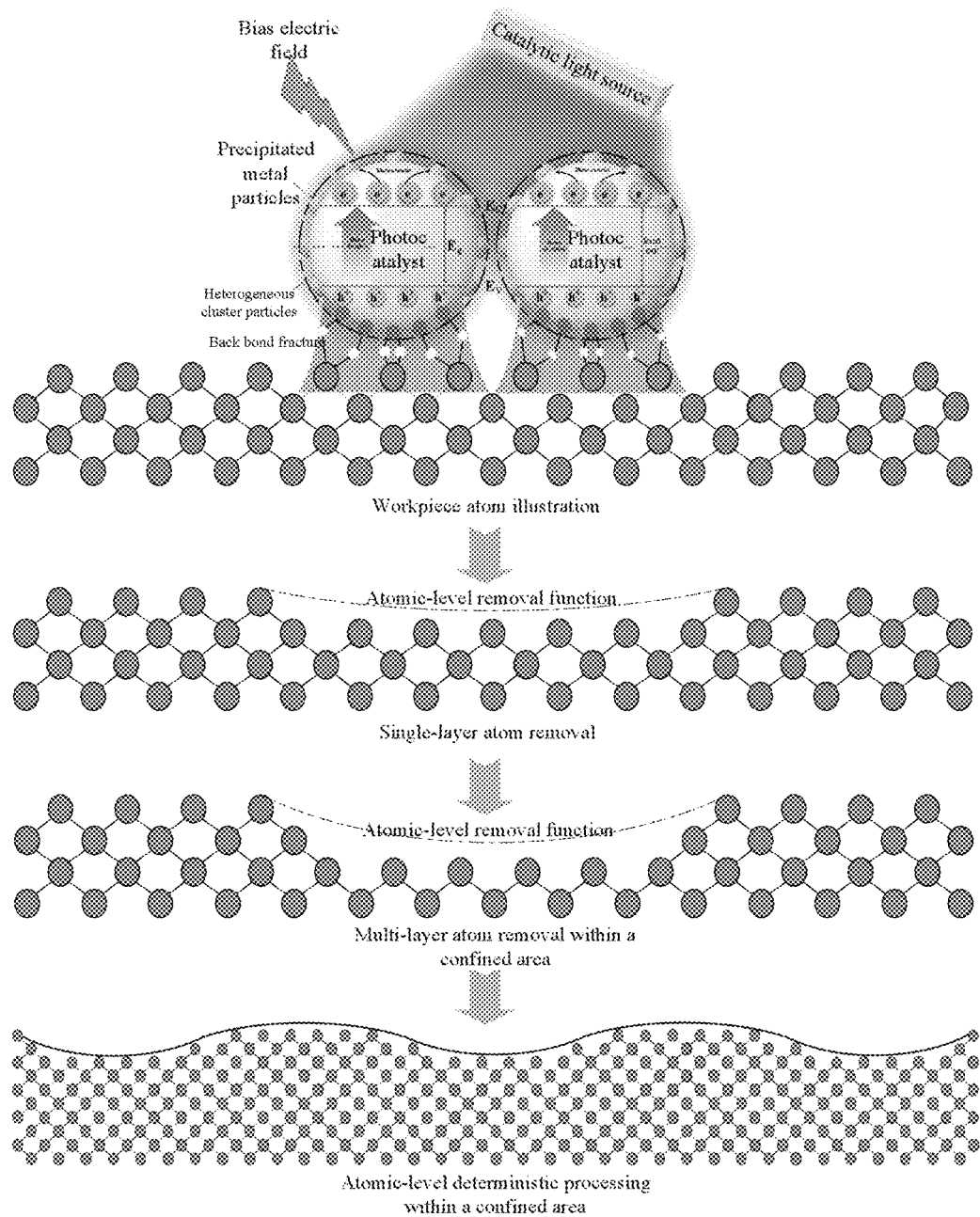
FIG. 3 is a principle diagram of a photoelectric fluid field cluster catalytic method for atomic-scale deterministic processing.

The specific principles of step 4 are illustrated in FIG. 3. In heterogeneous cluster particles (the photocatalytic medium with surface-deposited metal particles), the valence band electrons absorb the photon energy exceeding the bandgap and transition to the conduction band to generate photogenerated electrons ($e^-$) along with a large number of holes ($h^+$). Under the illumination of the catalytic light source, photocatalytic reactions occur, producing numerous hydroxyl radicals that are adsorbed onto the surface of the nanoparticle clusters, forming surface hydroxyl groups. Additionally, due to the large work function of the metal particles within the heterogeneous cluster particles, they readily capture photogenerated electrons from the conduction band of the photocatalytic medium, facilitating the transfer of photogenerated electrons and allowing holes to migrate to the surface of the heterogeneous cluster particles to participate in catalytic reactions, thereby prolonging the lifetime of the photogenerated carriers. The potentiometer provides a bias electric field to the workpiece, creating a spatial electric field on the surface of the photoelectrocatalytic clusters. This suppresses the recombination of electron-hole pairs while generating numerous new reactive sites on the surface of the metal particles, significantly increasing the photoelectrocatalytic reaction rate within a confined area. Due to the hydrophilic nature of the workpiece surface, it can also adsorb a large number of hydroxyl groups. The interfacial bridged bonds are formed through interfacial bonding reactions with the photoelectrocatalytic clusters. Driven by the flow field, this process leads to the breaking of the back bonds of the surface atoms, enabling the removal of material at the atomic layer level. Additionally, the amount of hydroxyl groups adsorbed on the surface of the photoelectrocatalytic clusters can be adjusted by regulating the power and wavelength of the catalytic light source, the fluid flow rate, and the potential difference between the workpiece and the counter electrode. This allows for the modulation of the localized synergistic photoelectrocatalytic reaction rate, and an atomic-level removal function within a confined area is generated, enabling deterministic and controllable removal with single-atomic-layer precision on any surface shape through deconvolution, thus realizing both single-layer and multi-layer atomic removal, further accomplishing atomic-level deterministic processing within the confined area.

Specific examples are applied herein to illustrate the principle and implementation of the disclosure. The above embodiments are only used to help understand the method of the disclosure and its core ideas. Those skilled in the art can make changes in terms of the specific implementation and application scope based on the ideas of the disclosure. To sum up, the content of this specification should not be construed as a limitation of the disclosure.

What is claimed is:

1. A photoelectric fluid field cluster catalytic method for atomic-scale deterministic processing, comprising the following steps:

S1, selecting nanoparticles with photocatalytic activity as a photocatalytic medium, and using a photoreduction method to realize a precipitation of metal nanoparticles on a surface of the photocatalytic medium, thus creating photoelectrocatalytic clusters;

S2, mixing the photoelectrocatalytic clusters with deionized water to prepare a polishing solution;

S3, illuminating a coupling area between a surface to be processed of a workpiece, the photoelectrocatalytic clusters and a flexible tool with a catalytic light source, and simultaneously applying a bias voltage to a conductive tray of the workpiece to control a potential of the workpiece and form a spatial electric field between the photoelectrocatalytic clusters and the workpiece; and S4, applying a load to a flexible tool head and setting a rotation speed to generate a hydrodynamic pressure that maintains a gap between the tool head and the workpiece surface, and driving the polishing solution in the gap to flow through a flow field, thus enabling controllable removal with atomic-level precision under an interfacial synergistic photoelectrocatalytic effect.

2. The photoelectric fluid field cluster catalytic method for atomic-scale deterministic processing according to claim 1, wherein in S1, using a photoreduction method to realize the precipitation of metal nanoparticles on a surface of the photocatalytic medium specifically comprises: uniformly dispersing the nanoparticles with photocatalytic activity in a metal salt solution, and irradiating the solution with ultraviolet light while performing magnetic stirring, allowing metal elements in the metal salt solution to capture photo-generated electrons on the surface of the photocatalytic medium, thus initiating a photoreduction reaction, resulting in the precipitation of the metal nanoparticles on the surface of the photocatalytic medium.

3. The photoelectric fluid field cluster catalytic method for atomic-scale deterministic processing according to claim 2, wherein in S1, the photocatalytic medium is one of $TiO_2$, $ZnO$, $SnO_2$, $ZrO_2$ and $CdS$, with a particle size of 20-100 nm, and the metal salt solution is a solution of platinum chloride or silver nitrate.

4. The photoelectric fluid field cluster catalytic method for atomic-scale deterministic processing according to claim 1, wherein in S2, the photoelectrocatalytic clusters are mixed with the deionize water at a ratio of 1-20 g/L to obtain the polishing solution.

5. The photoelectric fluid field cluster catalytic method for atomic-scale deterministic processing according to claim 1, wherein in S3, the workpiece is fixed to the conductive tray using conductive carbon paste and connected to a potentiometer, allowing the workpiece to function as a working electrode; additionally, a counter electrode and a reference electrode with a constant potential are added to the polishing solution, and a potential of the working electrode is controlled based on the reference electrode, thereby establishing a stable spatial electric field between the workpiece and the photoelectrocatalytic clusters.

6. The photoelectric fluid field cluster catalytic method for atomic-scale deterministic processing according to claim 5, wherein a potential difference between the counter electrode and the working electrode ranges from −50 V to +50 V.

7. The photoelectric fluid field cluster catalytic method for atomic-scale deterministic processing according to claim 1, wherein in S3, the catalytic light source is mounted on an adapter device, allowing for control over an emission angle of the catalytic light source and adjustment of a position of a light spot irradiated on the surface to be processed, thus ensuring continuous irradiation in the coupling area between the flexible tool, the photoelectrocatalytic clusters, and the workpiece; and the single-photon energy of the catalytic light source exceeds a bandgap of the photocatalytic medium, and a wavelength of the catalytic light source ranges from 200 nm to 800 nm.

8. The photoelectric fluid field cluster catalytic method for atomic-scale deterministic processing according to claim 1, wherein in S4, the normal load and the rotation speed are applied to the flexible tool head to create a balance between the hydrodynamic pressure and the load, resulting in a stable gap of 1-200 μm; the photoelectrocatalytic clusters are driven through the flow field into contact with the workpiece surface, resulting in an atomic-level controllable removal function within a confined area under the interfacial synergistic photoelectrocatalytic effect; additionally, a position of the tool is adjusted using x, y, and z displacement stages to adapt to a shape of the workpiece.

9. The photoelectric fluid field cluster catalytic method for atomic-scale deterministic processing according to claim 1, wherein in S4, adjustments to an output power and wavelength of the catalytic light source, the rotation speed of the flexible tool, and a potential difference applied between the workpiece and a counter electrode allow for control over localized photoelectrocatalytic reactions in the coupling area between the tool, the photoelectrocatalytic clusters, and the workpiece, and an atomic-level removal function within a confined area of the workpiece is generated, enabling deterministic and controllable removal with single-atomic-layer precision on any surface shape through deconvolution.

* * * * *